United States Patent [19]

Klein et al.

[11] 4,151,548
[45] Apr. 24, 1979

[54] COOLING CONTAINER FOR COOLING A SEMICONDUCTOR ELEMENT

[75] Inventors: Erwin Klein, Heddesheim; Arno Henke, Gorxheimertal; Hans Zink, Heddesheim, all of Fed. Rep. of Germany

[73] Assignee: BBC Brown, Boveri & Company, Limited, Mannheim, Fed. Rep. of Germany

[21] Appl. No.: 831,006

[22] Filed: Sep. 6, 1977

[30] Foreign Application Priority Data

Sep. 4, 1976 [DE] Fed. Rep. of Germany ....... 2640000

[51] Int. Cl.² .................... H01L 25/04; H01L 23/16; H01L 23/32
[52] U.S. Cl. ...................................... 357/82; 357/75; 357/76; 165/80
[58] Field of Search .............. 357/82; 174/15; 165/80, 165/105

[56] References Cited

U.S. PATENT DOCUMENTS

| 3,004,196 | 10/1961 | Drexel | 357/82 |
| 3,389,305 | 6/1968 | Bond | 357/82 |
| 3,573,574 | 4/1971 | Davis | 357/82 |
| 3,763,402 | 10/1973 | Shore et al. | 357/82 |

FOREIGN PATENT DOCUMENTS

| 2003573 | 11/1969 | France | 357/82 |
| 47-27270 | 9/1972 | Japan | 357/82 |

Primary Examiner—Andrew J. James
Attorney, Agent, or Firm—Oblon, Fisher, Spivak, McClelland & Maier

[57] ABSTRACT

A cooling container for liquid-cooled semiconductor construction elements wherein pegs are located in the interior of the container in the flow path of the cooling liquid and arranged vertically to the floors of the container and connected with these floors so that they are tight in regard to their material. Preferably, these pegs have a square cross-section and with one diagonal are located transversely to the flow direction. In addition, barriers are located at half the distance of flow in the cooling container, which are diametrically opposite for the purpose of narrowing the cross-section of the flow.

7 Claims, 3 Drawing Figures

COOLING CONTAINER FOR COOLING A SEMICONDUCTOR ELEMENT

BACKGROUND OF THE INVENTION

The invention concerns a cooling container for the cooling with liquid, especially of oil, of a semiconductor construction element which is thermically and electrically pressure-contacted with one with its container floors as well as a process for manufacturing such a container.

The cooling container is used for semiconductor (power) construction elements in disk cell construction with power losses in the order of several hundred watts and more with two-sided heat flow. For this purpose, in a generally known manner, cooling containers, through which the liquid passes, are by means of a tension device connected to the two main surfaces of the disk cell and are optionally held together in piles and/or coupled with each other by means of a liquid-transporting supporting rail. The semiconductor construction elements which are cooled in this manner can be used in rectifier facilities for the high tension direct current transmission (HGU), in electric locomotives or other fields of application.

Semiconductor construction elements which in regard to current are subjected to higher loads require coolers for the flow of their power loss. According to construction and setup, these semiconductor construction elements are unable to perform this task. The permissible power loss is represented by the quotient of the temperature gradients and the thermic resistance. The temperature gradient is formed as the difference of the permissible crystal temperature of the semiconductor element and the highest cooling temperature. The thermic resistance is a result of the semiconductor, the transition between it and the cooler and the latter itself (F. Korb, "Thermic Behavior of Power Semiconductors", Special Edition from "Industrial Electrical Engineering & Electronics," Year 20, Volume 19 and 21, 1975 = BBC Print D IA 60037 D). Since the two first terms of the total thermic resistance are specific to construction elements, only the decrease of the cooler resistance can result in an increase of the power loss and thus the current intensity.

The thermic resistance of a cooler consists of line resistance and transfer resistance, in which case the latter occurs because of the conditions of the transition of the heat to the cooling medium. The transfer resistance is inversely proportional to the product of heat-emitting surface and the coefficient of heat transfer. If this value is determined by the rate of the speed of the cooling agent and the surface structure, the heat-emitting surface must be increased in order to decrease the transfer resistance. However, this results in the fact that the total heat conduction resistance will increase. The result for metallic air coolers is a law of growth for weights and/or volume with an exponent of the power of $>3$.

In the case of the known cooling by means of heat ducts (Korb, above, M. Groll and B. Zimmermann, "Heat and Material Transfer," Vol 4, (1971), Page 39 to 47), the line resistance is reduced by the fact that one uses water vapor for transporting the heat over a certain distance. An air cooler is attached to the closed end of the heat duct. The condensate is led back through capillary tubes, networks or arteries. In the case of power losses in the order of 800 W — disk cell with two-sided heat flow — one can, in this case, reduce weight and volume to approximately 40% of a customary aluminum cooler.

If there are requirements for smaller weights and volumes, one must work with vapor or passing liquid as heat conveying means. Because of the significantly better coefficients of heat transfer of liquids as compared to air, one may get along with much smaller heat-emitting surfaces and thus with considerably reduced heat paths.

The most favorable coefficients of heat transfer for a noncirculating water cooling are furnished by water; they are one thousand times better than those furnished by air, referred to equal flow speeds and temperatures. However, water, because of operational conditions, for example, discontinuous operation, frost, inability to heat, cannot always be used and also requires longer hydraulic connecting lines in order to obtain a corresponding insulation level and, for its maintenance, an ion exchanger. In such cases, transformer oil, an insulating cooling agent which has proven itself in electronics, offers a solution. However, the heat transfer coefficient of transformer oil is only seventy times better than that of air, i.e., seventeen times worse than in the case of water.

SUMMARY OF THE INVENTION

Accordingly, it is an object of the present invention to find a constructive development of the cooling container which, even when a cooling agent is used which has a worse heat transfer coefficient than water, insures a comparable, acceptable relationship between heat conduction and weight or volume of the cooler.

The objects of the invention are achieved by locating pegs in the interior of the cooling container which, in the flow path of the cooling liquid are arranged vertically to the floors of the containers and are connected with these floors so that they are tight in regard to their material.

Preferably, these pegs have a square cross section and with one diagonal are located transversely to the flow direction. In addition, barriers are preferably located at half the distance of flow in the cooling container, which are diametrically opposite for the purpose of narrowing the cross section of the flow.

Advantageously, a cooling container constructed in this manner possesses a considerably higher heat conduction capacity than customary cooling containers. Because of the location of the peg diagonals transversely to the direction of flow, there are turbulences which raise the heat transfer coefficient. By means of the barriers arranged vertically to the flow direction, the flow speed in the center of the cooling container is increased, which again causes an increase of the heat transfer value. The material-tight connection of the pegs or pins with the floors of the containers serves the same purpose.

At the same time, the pegs which reach from one floor of the container to another floor of the container make the container ... stable, so that the bottoms of the containers may be constructed to be very thin and short heat paths occur. If the container consists of two halfs which are tightly connected with each other, the pegs of the halfs are constructed in such a way that they support each other.

The arrangement of the pegs also results in the decisive advantage that relatively large heat-emitting surfaces are created to which the energy is transported along the shortest path. The heat transfer coefficient which in regard to water is unfavorable and which is indicated by the transformer oil may therefore be accepted because of the obtained small thermic resistance. Because of the corresponding structure of the surface, the otherwise laminar course of the flow, as already mentioned, becomes turbulent, so that the heat emission from the bottom of the cooling container and the pegs to the cooling liquid is improved. Naturally, it must be observed in this case that the hydraulic efficiency does not rise as much as this would be the case if the same effect were achieved only by the increase of the flow speed.

In addition to constructing the cooling container to consist of two equal halves, it may also be constructed in one piece, including the pegs, or consist of three pieces, one tube section and two floors carrying the pegs.

Preferably at least one plate with supports is slid on the pegs. The outside limits of this plate correspond to the inside edge of the container. In this case, the plate or plates may be held on the pegs in a press fit or may be soldered to the pegs. This measure further improves the heat resistance of the cooling container, namely by about 20%; for the heat transfer resistance of the cooling container is inversely proportional to the heat transfer coefficient and the size of the heat emitting surface.

The invention is also based on the task of describing a rational process for the mass production of cooling containers.

A preferred solution of this task is the following: A sand mold of the outside shape of the cooling container consisting of two equal parts is glued together with an inserted core which corresponds to the inside space of the cooling container. This mold is molded and burnt out and liquid metal is poured into the resulting cavity. By means of this high-quality casting process, the cooling container can be manufactured in one piece and without soldering.

In connection with high-quality casting, it is generally known to work with "sand molds". These correspond to the positive and consist of plastic. After the molding, the plastic is burnt out and liquid metal is poured into the resulting cavity. However, because of the pegs, the interior sides of the cooling container have a fine structure. Therefore, the molding sand cannot or only in insufficient condensation be brought into the cavity. By means of the process according to the invention, also finely structured cores with sufficient stability to the pressure of metal (risers) can be manufactured and washed out perfectly after the metal is solidified.

For special applications, such as the manufacturing of smaller series of cooling containers, one variant of the solution of the above mentioned task consists in the fact that a tube section by means of hard-soldering is connected with two floors which by means of a shaving or cutting process are equipped with patterns of pegs.

Another variant of the solution according to the invention consists in the fact that two pressed or forged halves of cooling containers with pegs on their contact surfaces are soldered to each other. In the case of the mold which is dropforged, one can in a simple manner, before the two equal halves of the container are soldered together, slide the above mentioned plates over the pegs.

BRIEF DESCRIPTION OF THE DRAWINGS

In the following, the invention is described on the basis of the construction example shown in the drawing.

DETAILED DESCRIPTION OF THE PREFERRED EMBODIMENTS

Figure 1:
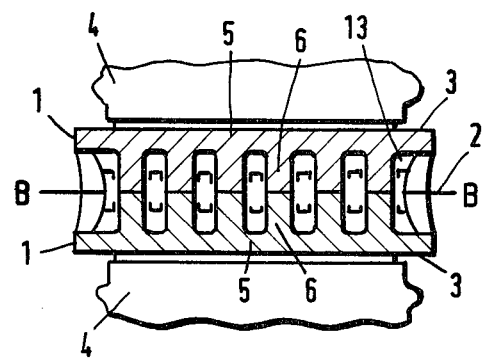
FIG. 1 shows a section of the cooling container, along the line A — A in FIG. 2.

In the shown construction example, the cooling container consists of two halves 1 which are manufactured as molded pieces. These are, with their bases 2 soldered along the contact surfaces which are parallel to line of intersection B — B. Semiconductor construction elements (disk cells) 4 border on the frontal surfaces 3. These semiconductor construction elements 4, by means of a tension device which is not shown, are in contact with the cooling container thermically and/or electrically. In reverse to this piling technique, an individual power semiconductor construction element may also be equipped with two cooling containers at its two main surfaces.

The cooling container halves 1 have container bottoms 5 and square pegs or pins 6.

Figure 2:
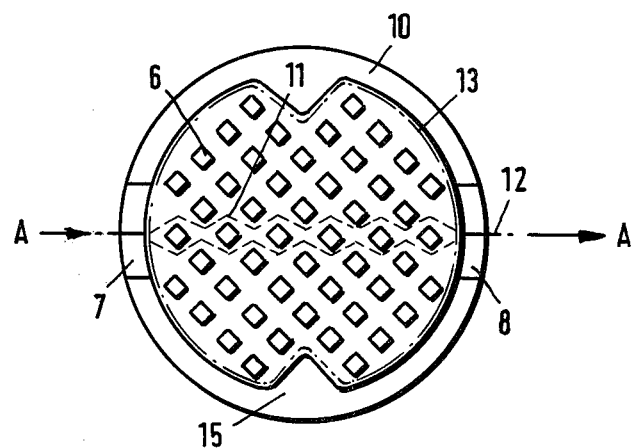
FIG. 2 shows a section along line B — B in FIG. 1
Figure 3:
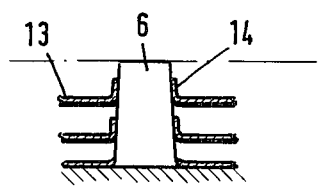
FIG. 3 shows a peg with plates.

FIG. 2 shows that at its edge 10 the cooling container has an inlet and and outlet opening 7 and 8 for the cooling liquid which is preferably transformer oil 11. The transformer oil is shown by means of two broken flow lines; the flow direction is shown by arrow 12. A dash-dotted line in FIG. 2 shows that plates 13 are located on the peg 6. These plates have passages 14 for the mounting on the pegs 6 (FIG. 3). The plates 13 have an outside limit which is adapted to the casing of the container 10 on its interior side. In addition, barriers 15 may be provided at about half the distance of the flow path in the cooling container which are diametrically opposite each other. These barriers 15 narrow the cross section of the flow. In this case, the plates 13 are adapted to the inside contour of the cooling container.

In the following, the method of operation of the cooling container is explained. The heat flows from the semiconductor construction elements 4 over the frontal surfaces 3 and the bottoms or floors of the container 5 into the square pegs or pins 6. From their surface, it is led off to the flowing transformer oil 11. The flow direction 12 is placed in such a way that by rerouting and cross section expansions, turbulences will occur. For this purpose, the axis, which is enclosed by inlet opening 7 and outlet opening 8, is placed on one of the diagonals of the center row of pegs. In addition, for this purpose, the barriers 15 which are vertical to the flow axis and diametrically opposite are inserted. These barriers 15 have the result that the flow speed in the center of the cooling container, at the point of the largest power (capacity) density, is increased and thus a better heat transfer coefficient is produced.

The large number of pegs 6, the cover-like position of the pegs 6 of two container halves and their solderings result in a container which is resistant to compression, because of the frontal surfaces 3. This container makes it possible to keep the floors very thin and therefore the heat paths very short. As already mentioned, the formation of pegs results in a considerable increase in surface area and the resulting loss of heat-conducting cross section is, in this case easily overcompensated.

In the case of a cooling container which, as mentioned above, consists of parts that were subjected to cutting or shaving, container floors 5 with pegs or pins 6, structures that almost have the shape of a hedgehog, are inserted in this case from both sides into the casing or tube section 10 which extends over the whole height of the container. These floors or bottoms 5 are soldered under pressure, between the pegs 6 as well as between the floor 5 and the respective edge of the tube section 10.

In the case of the dropforged mold, the plates 13 are slid over the pegs 6 before the soldering. In order to be able to slide the plates 13 over the pegs 6, the square passages 14 are present, the clear cross section of which is somewhat smaller than the cross section of the peg. By means of a suitable tool, the plates 13 are slid on the pegs, which causes a coupled contact between the pegs 6 and the plates 13. As already mentioned, there is also the possibility of a material-tight connection between the pegs and the plates by means of soldering.

Even in the cooling container made by means of high-quality casting techniques which consists of one piece, additional walls can be provided which increase the surface and still permit the passage of the cooling liquid.

When using transformer oil as cooling liquid, the cooling liquid, in the case of otherwise comparable data, possesses only half the heat resistance of a customary oil cooling container. With an achievable heat resistance of 0,03 K/W, the oil cooling container according to the invention is within the range of water cooling containers. However, it does not have the problems which were described earlier in regard to the latter.

What is claimed as new and desired to be secured by Letters Patent of the United States is:

1. In a cooling container for cooling a semiconductor element exhibiting main external surfaces, wherein said main surfaces of said semiconductor element are maintained in contact with said cooling container by means of a pressure contact, said container formed of at least two parts which define a flow path therebetween through which flows a cooling liquid, preferably oil, the improvement comprising: said two container parts comprising identical complementary halves, each having a bottom portion and a rim, said rims having formed therein diametrically opposed inlet and outlet openings by which said liquid passes through said cooling container, the inlet and output openings defining a longitudinal axis of said flow path, a plurality of square cross-sectional pins extending perpendicularly from said bottom portions, the corresponding pins of each container half tightly connected in rows diagonally oriented with respect to said longitudinal axis such that a plurality of generally zigzag cooling channels are formed in the flow path between said openings, said square pins oriented with the opposed corners thereof respectively parallel and perpendicular to said longitudinal axis of said flow path, whereby said pins are disposed with one pair of opposed corners facing upstream and downstream of liquid flow in said flow path.

2. A cooling container according to claim 1 wherein said rims of said container halves further comprise:
flow barriers diametrically oppositely disposed approximately midway in said flow path between said inlet and outlet openings in order to decrease the cross sectional areas of said flow path at said barriers.

3. A cooling container according to claim 1 wherein said correspondingly disposed square cross-sectional pins of said bottom portions rest upon each other.

4. A cooling container according to claim 1 further comprising:
a third part consisting of a pipe section connected to said inlet and outlet openings for channeling liquid to these openings.

5. A cooling container according to claim 1 further comprising:
at least one metal sheet supported on said pins and having an outer border which corresponds with the inner dimensions of said rim; and,
means for supporting said metal sheet on said pins.

6. A cooling container according to claim 5 wherein said at least one metal sheet is press fit on said pins.

7. A cooling container according to claim 5, wherein said at least one metal sheet is soldered to said pins.

* * * * *